(12) United States Patent
Lee

(10) Patent No.: US 9,627,018 B1
(45) Date of Patent: Apr. 18, 2017

(54) SEMICONDUCTOR DEVICES AND SEMICONDUCTOR SYSTEMS INCLUDING THE SAME

(71) Applicant: SK hynix Inc., Icheon-si Gyeonggi-do (KR)

(72) Inventor: Sang Hoon Lee, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/197,976

(22) Filed: Jun. 30, 2016

(51) Int. Cl.
  *G11C 7/04* (2006.01)
  *G11C 7/22* (2006.01)
  *G11C 7/10* (2006.01)
  *G11C 8/10* (2006.01)

(52) U.S. Cl.
  CPC .............. *G11C 7/222* (2013.01); *G11C 7/106* (2013.01); *G11C 7/1084* (2013.01); *G11C 8/10* (2013.01)

(58) Field of Classification Search
  CPC ................ G11C 7/04; G11C 11/06007; G11C 11/40626
  USPC .......................... 365/211, 226, 233.1, 233.11
  See application file for complete search history.

(56) References Cited

U.S. PATENT DOCUMENTS

2009/0108949 A1   4/2009  Yan et al.
2016/0301390 A1*  10/2016 Park ........................ G11C 7/20
2016/0307616 A1*  10/2016 Rim ..................... G11C 11/4074

FOREIGN PATENT DOCUMENTS

KR        1020100087969 A      8/2010

* cited by examiner

*Primary Examiner* — Han Yang
(74) *Attorney, Agent, or Firm* — William Park & Associates Ltd.

(57) ABSTRACT

A semiconductor device may be provided. The semiconductor device may include a stop signal generation circuit configured to compare an operation offset signal with an operation temperature code signal to generate a stop signal. The semiconductor device may include a temperature signal output circuit configured to generate an output temperature signal from a sensed temperature signal in synchronization with an operation clock signal which is generated based on the stop signal. The semiconductor4 device may include a temperature code processing circuit configured to receive a temperature difference code signal corresponding to the output temperature signal to generate the operation temperature code signal in synchronization with the operation clock signal.

27 Claims, 19 Drawing Sheets

FIG.8

| OFFS<2:1> | OFFS_D<4:1> | offset |
|---|---|---|
| '00' | '0001' | X |
| '01' | '0010' | 20℃ |
| '10' | '0100' | 40℃ |
| '11' | '1000' | 60℃ |

FIG.10

| TEMP (°C) | 10 | 30 | 50 | 60 | 70 | 80 | 100 | 120 |
|---|---|---|---|---|---|---|---|---|
| T_OUT <3:1> | '111' | '110' | '101' | '100' | '011' | '010' | '001' | '000' |
| T_DEC <8:1> | '00000001' | '00000010' | '00000100' | '00001000' | '00010000' | '00100000' | '01000000' | '10000000' |
| T_DIF <2:1> | '10' | '10' | '01' | '01' | '01' | '10' | '10' | x |

FIG.11

| T_SUM<br><3:1> | '000' | '001' | '010' | '011' | '100' | '101' | '110' | '111' |
|---|---|---|---|---|---|---|---|---|
| ICD_OP<br><8:1> | '00000001' | '00000010' | '00000100' | '00001000' | '00010000' | '00100000' | '01000000' | '10000000' |
| OFFS_D<br><4:1> | '0001' | | '0010' | | '0100' | | '1000' | |

FIG.15

| TEMP (°C) | 10 | 30 | 50 | 60 | 70 | 80 | 100 | 120 |
|---|---|---|---|---|---|---|---|---|
| T_OUT <3:1> | '000' | '001' | '010' | '011' | '100' | '101' | '110' | '111' |
| T_DIF <2:1> | '01' | '01' | '01' | '01' | '01' | '10' | '10' | X |

FIG.16

| T_SUM<br><3:1> | '000' | '001' | '010' | '011' | '100' | '101' | '110' | '111' |
|---|---|---|---|---|---|---|---|---|
| OFFS<br><2:1> | '00' | | '01' | | '10' | | '11' | |

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2016-0005649, filed on Jan. 15, 2016, which is herein incorporated by references in its entirety.

BACKGROUND

1. Technical Field

Embodiments of the present disclosure generally relate to semiconductor devices, and, more particularly, to semiconductor devices generating temperature signals and semiconductor systems including the generating the same.

2. Related Art

Many semiconductor devices, such as dynamic random access memory (DRAM) devices, may be designed to include a plurality of memory cells. Many of the memory cells may be configured to include a single transistor (also, referred to as a cell transistor) and a single capacitor (also, referred to as a cell capacitor). A data retention characteristic of the DRAM cell may be very sensitive to temperature. Thus, it may be necessary to control an operation condition of the circuit blocks within a semiconductor system according to variation in an internal temperature of a semiconductor device employed in the semiconductor system. Temperature sensors such as digital temperature sensor regulators (DTSRs) or analog temperature sensor regulators (ATSRs), or design schemes such as digital temperature compensated self-refresh (DTCSR) techniques have been widely used to control the operation conditions of semiconductor devices such as DRAM devices according to variations in the circumferential temperature.

SUMMARY

According to an embodiment, a semiconductor device may be provided. The semiconductor device may include a stop signal generation circuit configured to compare an operation offset signal with an operation temperature code signal to generate a stop signal. The semiconductor device may include a temperature signal output circuit configured to generate an output temperature signal from a sensed temperature signal in synchronization with an operation clock signal which is generated based on the stop signal. The semiconductor device may include a temperature code processing circuit configured to receive a temperature difference code signal corresponding to the output temperature signal to generate the operation temperature code signal in synchronization with the operation clock signal.

According to an embodiment, a semiconductor device may be provided. The semiconductor device may include a temperature signal output circuit configured to generate an output temperature signal from a sensed temperature signal in synchronization with an operation clock signal if a reset pulse signal is generated and configured to perform a predetermined arithmetic operation on the output temperature signal in synchronization with the operation clock signal if the reset pulse signal is not generated. The semiconductor device may include a temperature code processing circuit configured to generate an operation temperature code signal by adding temperature differences about internal temperatures corresponding to the output temperature signal. The semiconductor device may include a stop signal generation circuit configured to generate a stop signal for controlling generation of the operation clock signal based on the operation temperature code signal.

According to an embodiment, a semiconductor device may be provided. The semiconductor device may include a stop signal generation circuit configured to compare an offset signal with a sum temperature code signal to generate a stop signal. The semiconductor device may include a temperature signal output circuit configured to generate an output temperature signal from a sensed temperature signal in synchronization with an operation clock signal which is generated based on the stop signal. The semiconductor device may include a temperature code processing circuit configured to receive a temperature difference code signal corresponding to the output temperature signal to generate the sum temperature code signal in synchronization with the operation clock signal.

According to an embodiment, a semiconductor system may be provided. The semiconductor system may include a first semiconductor device and a second semiconductor device. The first semiconductor device may output an offset signal, a clock signal and an update signal. The second semiconductor device may compare an operation offset signal generated from the offset signal with an operation temperature code signal to generate a stop signal and may generate an operation clock signal from the clock signal based on the stop signal. The second semiconductor device may generate an output temperature signal from a sensed temperature signal in synchronization with the operation clock signal and may sequentially receive a temperature difference code signal corresponding to the output temperature signal to generate the operation temperature code signal in synchronization with the operation clock signal.

BRIEF DESCRIPTION OF THE DRAWINGS

FIG. 8 is a table illustrating a representation of an example of an operation of an offset signal input circuit included in the semiconductor device of FIG. 1.

FIGS. 10, 11 and 12 illustrate representations of examples of an operation for generating a stop signal.

FIGS. 15, 16 and 17 illustrate representations of examples of an operation of the semiconductor device illustrated in FIGS. 13 and 14.

DETAILED DESCRIPTION

Various embodiments may be directed to semiconductor devices generating temperature signals and semiconductor systems including the same.

Various embodiments of the present disclosure will be described hereinafter with reference to the accompanying drawings. However, the embodiments described herein are for illustrative purposes only and are not intended to limit the scope of the present disclosure.

Figure 1:
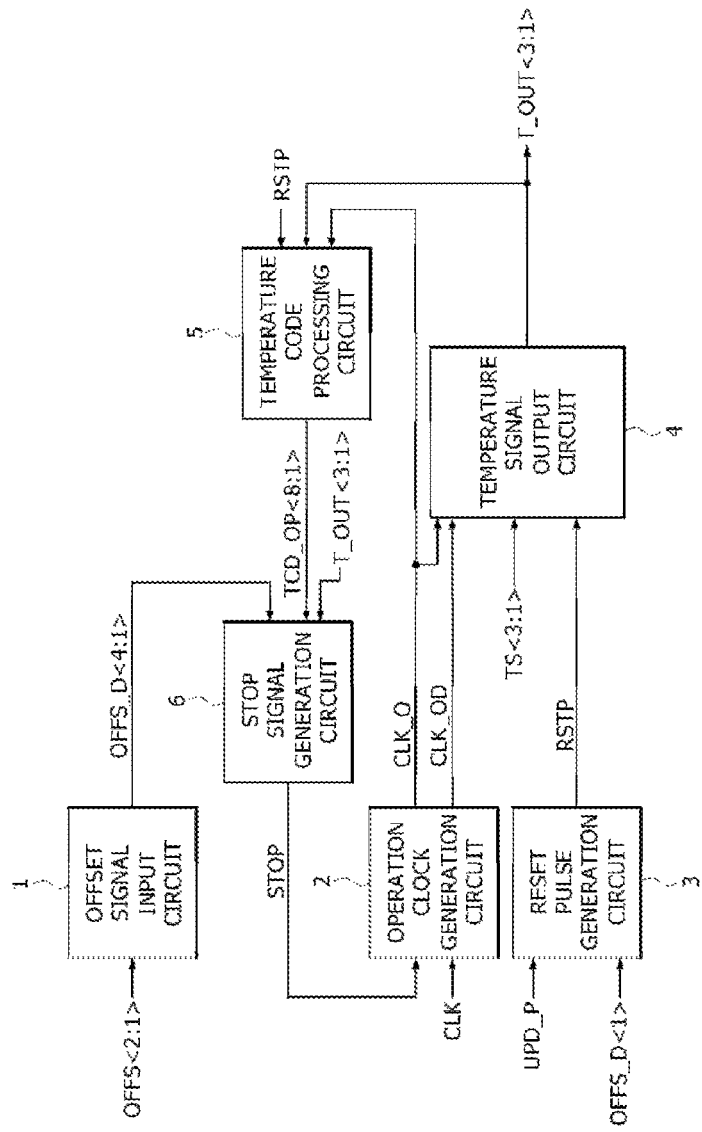
FIG. 1 is a block diagram illustrating a representation of an example of a semiconductor device according to an embodiment.

Referring to FIG. 1, a semiconductor device according to an embodiment may include an offset signal input circuit 1, an operation clock generation circuit 2, a reset pulse generation circuit 3, a temperature signal output circuit 4, a temperature code processing circuit 5, and a stop signal generation circuit 6.

The offset signal input circuit 1 may generate an operation offset signal OFFS_D<4:1> in response to an offset signal OFFS<2:1>. The offset signal input circuit 1 may be realized using a decoder that decodes the offset signal OFFS<2:1> to generate the operation offset signal OFFS_D<4:1>. The offset signal OFFS<2:1> may be an external signal provided by an external device. In some embodiments, the offset signal OFFS<2:1> may be an internal signal generated in the semiconductor device. The offset signal OFFS<2:1> may include offset information on a temperature difference between a sensed temperature and an internal temperature. A logic level combination of the operation offset signal OFFS_D<4:1> may be determined according to a logic level combination of the offset signal OFFS<2:1>.

The operation clock generation circuit 2 may generate an operation clock signal CLK_O and a delayed operation clock signal CLK_OD from a clock signal CLK in response to a stop signal STOP. For example, the operation clock generation circuit 2 may buffer the clock signal CLK to generate the operation clock signal CLK_O and may delay the operation clock signal CLK_O by a predetermined time to generate the delayed operation clock signal CLK_OD, if the stop signal STOP is disabled. A configuration and an operation of the operation clock generation circuit 2 will be described with reference to FIG. 2 later.

The reset pulse generation circuit 3 may generate a reset pulse signal RSTP in response to an update signal UPD_P and the operation offset signal OFFS_D<1>. For example, the reset pulse generation circuit 3 may generate the reset pulse signal RSTP which is enabled if at least one of the update signal UPD_P and the operation offset signal OFFS_D<1> is enabled. The update signal UPD_P may be set to be enabled whenever a predetermined update section elapses. For example, the update signal UPD_P may be set to be enabled whenever a time of 8 milliseconds elapses if the operation clock signal CLK_O has a cycle time of 0.5 microseconds. The operation offset signal OFFS_D<1> may be set to be enabled if the temperature difference between the sensed temperature and the internal temperature is zero. In some embodiments, the reset pulse generation circuit 3 may be realized to generate the reset pulse signal RSTP in response to the operation offset signal OFFS_D<4:1>. A configuration and an operation of the reset pulse generation circuit 3 will be described with reference to FIG. 3 later.

The temperature signal output circuit 4 may receive a sensed temperature signal TS<3:1> to output an output temperature signal T_OUT<3:1> in response to the reset pulse signal RSTP, the operation clock signal CLK_O and the delayed operation clock signal CLK_OD. The temperature signal output circuit 4 may buffer the sensed temperature signal TS<3:1> to output the output temperature signal T_OUT<3:1> in synchronization with the operation clock signal CLK_O, if the reset pulse signal RSTP is enabled. The temperature signal output circuit 4 may perform a predetermined arithmetic operation on the sensed temperature signal TS<3:1> in synchronization with the operation clock signal CLK_O and may output the output temperature signal T_OUT<3:1> in synchronization with the operation clock signal CLK_O, while the reset pulse signal RSTP is not generated. For example, the temperature signal output circuit 4 may output the output temperature signal T_OUT<3:1> that is counted in synchronization with the operation clock signal CLK_O, while the reset pulse signal RSTP is not generated. A configuration and an operation of the temperature signal output circuit 4 will be described with reference to FIGS. 4 and 5 later.

The temperature code processing circuit 5 may generate an operation temperature code signal TCD_OP<8:1> from the output temperature signal T_OUT<3:1> in response to the operation clock signal CLK_O. The temperature code processing circuit 5 may generate the operation temperature code signal TCD_OP<8:1> by adding temperature difference information about each internal temperature corresponding to the output temperature signal T_OUT<3:1> that is inputted in synchronization with the operation clock signal CLK_O. The temperature code processing circuit 5 may initialize the operation temperature code signal TCD_OP<8:1> if the reset pulse signal RSTP is enabled. A configuration and an operation of the temperature code processing circuit 5 will be described with reference to FIG. 6 later.

The stop signal generation circuit 6 may generate the stop signal STOP in response to the operation temperature code signal TCD_OP<8:1>, the operation offset signal OFFS_D<4:1> and the output temperature signal T_OUT<3:1>. For example, the stop signal generation circuit 6 may generate the stop signal STOP which is enabled if the operation temperature code signal TCD_OP<8:1> and the operation offset signal OFFS_D<4:1> are signals that correspond to each other. The stop signal generation circuit 6 may generate the stop signal STOP which is enabled if the output temperature signal T_OUT<3:1> has a predetermined logic level combination indicating that arithmetic operations cannot be performed any more. A configuration and an operation of the stop signal generation circuit 6 will be described with reference to FIG. 7 later.

Figure 2:
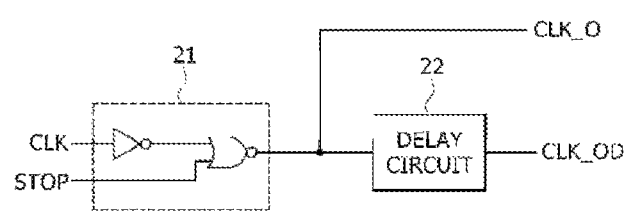
FIG. 2 is a circuit diagram illustrating a representation of an example of an operation clock generation circuit included in the semiconductor device of FIG. 1.

Referring to FIG. 2, the operation clock generation circuit 2 may include a clock synthesizer 21 and a delay circuit 22.

The clock synthesizer 21 may generate the operation clock signal CLK_O from the clock signal CLK in response to the stop signal STOP. The clock synthesizer 21 may buffer the clock signal CLK to generate the operation clock signal CLK_O if the stop signal STOP is disabled. The clock synthesizer 21 may generate the operation clock signal CLK_O having a logic "low" level regardless of the clock signal CLK if the stop signal STOP is enabled to have a logic "high" level.

The delay circuit 22 may delay the operation clock signal CLK_O by a predetermined delay time to generate the delayed operation clock signal CLK_OD. The predetermined delay time of the delay circuit 22 may be set to be different according to the embodiments.

The operation clock generation circuit 2 may buffer the clock signal CLK to generate the operation clock signal CLK_O and may delay the operation clock signal CLK_O by a predetermined delay time to generate the delayed operation clock signal CLK_OD, if the stop signal STOP is disabled.

Figure 3:
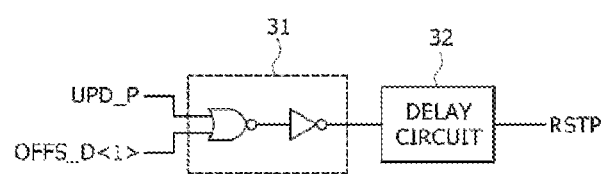
FIG. 3 is a circuit diagram illustrating a representation of an example of a reset pulse generation circuit included in the semiconductor device of FIG. 1.

Referring to FIG. 3, the reset pulse generation circuit 3 may include a signal synthesizer 31 and a delay circuit 32.

The signal synthesizer 31 may receive the update signal UPD_P and the operation offset signal OFFS_D<1> to execute an OR operation of the update signal UPD_P and the operation offset signal OFFS_D<1>. The signal synthesizer 31 may output a signal having a logic "high" level if at least one of the update signal UPD_P and the operation offset signal OFFS_D<1> has a logic "high" level. In the present embodiment, a logic level of the update signal UPD_P and the operation offset signal OFFS_D<1> which are enabled may be set to be a logic "high" level. However, in some embodiments, a logic level of the update signal UPD_P and the operation offset signal OFFS_D<1> which are enabled may be set to be a logic "low" level.

The delay circuit 32 may delay an output signal of the signal synthesizer 31 by a predetermined delay time to output the delayed signal as the reset pulse signal RSTP. The delay circuit 32 may generate the reset pulse signal RSTP which is enabled to have a logic "high" level if the output signal of the signal synthesizer 31 has a logic "high" level.

The reset pulse generation circuit 3 may generate the reset pulse signal RSTP which is enabled if at least one of the update signal UPD_P and the operation offset signal OFFS_D<1> is enabled. The update signal UPD_P may be set to be enabled whenever a time of 8 milliseconds elapses if the operation clock signal CLK_O has a cycle time of 0.5 microseconds, and the operation offset signal OFFS_D<1> may be set to be enabled if the temperature difference between the sensed temperature and the internal temperature is zero.

Figure 4:
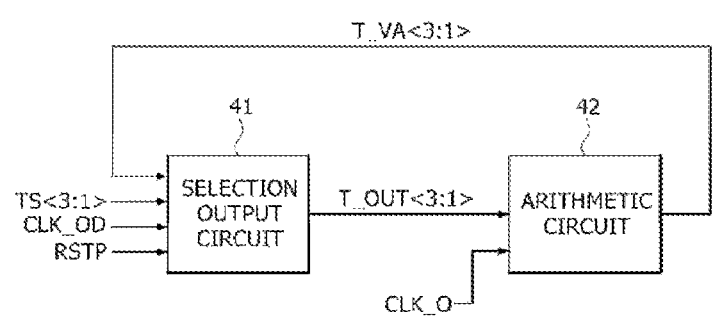
FIG. 4 is a block diagram illustrating a representation of an example of a temperature signal output circuit included in the semiconductor device of FIG. 1.

Referring to FIG. 4, the temperature signal output circuit 4 may include a selection output circuit 41 and an arithmetic circuit 42.

The selection output circuit 41 may receive a variable temperature signal T_VA<3:1> and the sensed temperature signal TS<3:1> to output the output temperature signal T_OUT<3:1> in response to the reset pulse signal RSTP and the delayed operation clock signal CLK_OD. The selection output circuit 41 may selectively output the sensed temperature signal TS<3:1> as the output temperature signal T_OUT<3:1> in synchronization with the delayed operation clock signal CLK_OD, if the reset pulse signal RSTP is enabled. The selection output circuit 41 may selectively output the variable temperature signal T_VA<3:1> as the output temperature signal T_OUT<3:1> in synchronization with the delayed operation clock signal CLK_OD, if the reset pulse signal RSTP is disabled.

The arithmetic circuit 42 may execute a predetermined operation on the output temperature signal T_OUT<3:1> to generate the variable temperature signal T_VA<3:1> in response to the operation clock signal CLK_O. For example, the arithmetic circuit 42 may execute an operation on the output temperature signal T_OUT<3:1> to generate the variable temperature signal T_VA<3:1> in synchronization with the operation clock signal CLK_O. For example, the arithmetic circuit 42 may count down the output temperature signal T_OUT<3:1> by one bit to generate the variable temperature signal T_VA<3:1> in synchronization with a rising edge of the operation clock signal CLK_O. The operation executed by the arithmetic circuit 42 may set differently according to the embodiments.

Figure 5:
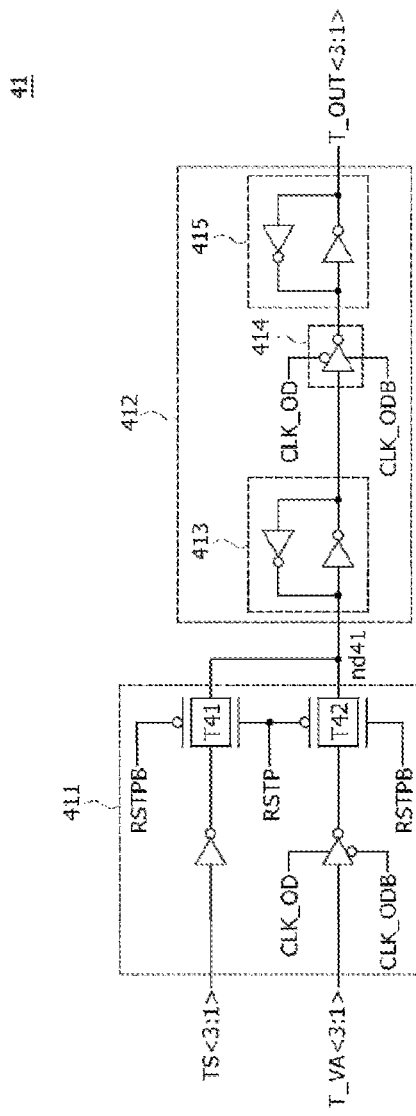
FIG. 5 is a circuit diagram illustrating a representation of an example of a selection output circuit included in the temperature signal output circuit of FIG. 4.

Referring to FIG. 5, the selection output circuit 41 may include a selection input buffer 411 and an output latch 412.

The selection input buffer 411 may include transfer gates T41 and T42 and may output the variable temperature signal T_VA<3:1> or the sensed temperature signal TS<3:1> to a node nd41 in response to the reset pulse signal RSTP, an inverted reset pulse signal RSTPB, the delayed operation clock signal CLK_OD and an inverted delayed operation clock signal CLK_ODB. The inverted reset pulse signal RSTPB may be generated by inversely buffering the reset pulse signal RSTP. The selection input buffer 411 may inversely buffer the sensed temperature signal TS<3:1> to output the inversely buffered signal to the node nd41 through the transfer gate T41 which is turned on if the reset pulse signal RSTP is enabled to have a logic "high" level. The selection input buffer 411 may inversely buffer the variable temperature signal T_VA<3:1> in synchronization with the delayed operation clock signal CLK_OD and the inverted delayed operation clock signal CLK_ODB to output the inversely buffered signal to the node nd41 through the transfer gate T42 which is turned on if the reset pulse signal RSTP is disabled to have a logic "low" level. The inverted delayed operation clock signal CLK_ODB may be generated by inversely buffering the delayed operation clock signal CLK_OD.

The output latch 412 may include latches 413 and 414 and a buffer 414 and may generate the output temperature signal T_OUT<3:1> from a signal of the nd41 in response to the delayed operation clock signal CLK_OD and the inverted delayed operation clock signal CLK_ODB. The buffer 414 may execute an operation for buffering an output signal of the latch 413 in response to the delayed operation clock signal CLK_OD and the inverted delayed operation clock signal CLK_ODB. For example, the output latch 412 may inversely buffer a signal of the node nd41 to output the buffered signal as the output temperature signal T_OUT<3: 1> in synchronization with a falling edge of the delayed operation clock signal CLK_OD.

Figure 6:
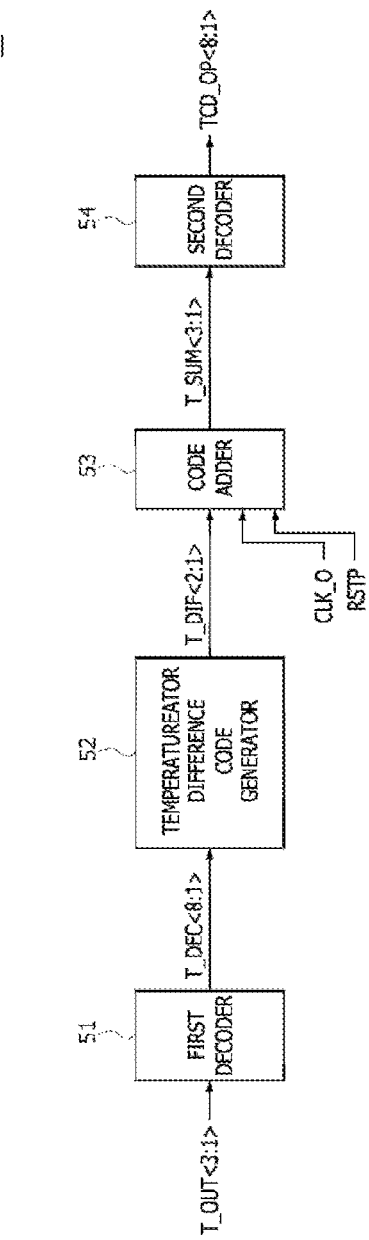
FIG. 6 is a block diagram illustrating a representation of an example of a temperature code processing circuit included in the semiconductor device of FIG. 1.

Referring to FIG. 6, the temperature code processing circuit 5 may include a first decoder 51, a temperature difference code generator 52, a code adder 53 and a second decoder 54.

The first decoder 51 may decode the output temperature signal T_OUT<3:1> to generate a temperature decoded code signal T_DEC<8:1>. A logic level combination of the temperature decoded code signal T_DEC<8:1> may be determined according to a logic level combination of the output temperature signal T_OUT<3:1>. Internal temperatures of the semiconductor device corresponding to logic level combinations of the temperature decoded code signal T_DEC<8: 1> may be set differently according to the embodiments.

The temperature difference code generator 52 may generate a temperature difference code signal T_DIF<2:1> in response to the temperature decoded code signal T_DEC<8: 1>. The temperature difference code generator 52 may generate the temperature difference code signal T_DIF<2:1> including the temperature difference information about each internal temperature of the semiconductor device corresponding to a logic level combination of the temperature decoded code signal T_DEC<8:1>.

The code adder 53 may add the temperature difference code signal T_DIF<2:1> to generate a sum temperature code signal T_SUM<3:1> in response to the operation clock signal CLK_O. For example, the code adder 53 may sequentially add the temperature difference code signal T_DIF<2: 1> inputted in synchronization with the operation clock signal CLK_O to generate the sum temperature code signal T_SUM<3:1>. The code adder 53 may initialize the sum temperature code signal T_SUM<3:1> if the reset pulse signal RSTP is enabled. A logic level combination of the sum temperature code signal T_SUM<3:1> which is initialized may be set differently according to the embodiments.

The second decoder 54 may decode the sum temperature code signal T_SUM<3:1> to generate the operation temperature code signal TCD_OP<8:1>. A logic level combination of the operation temperature code signal TCD_OP<8: 1> may be determined according to a logic level combination of the sum temperature code signal T_SUM<3: 1>.

Figure 7:
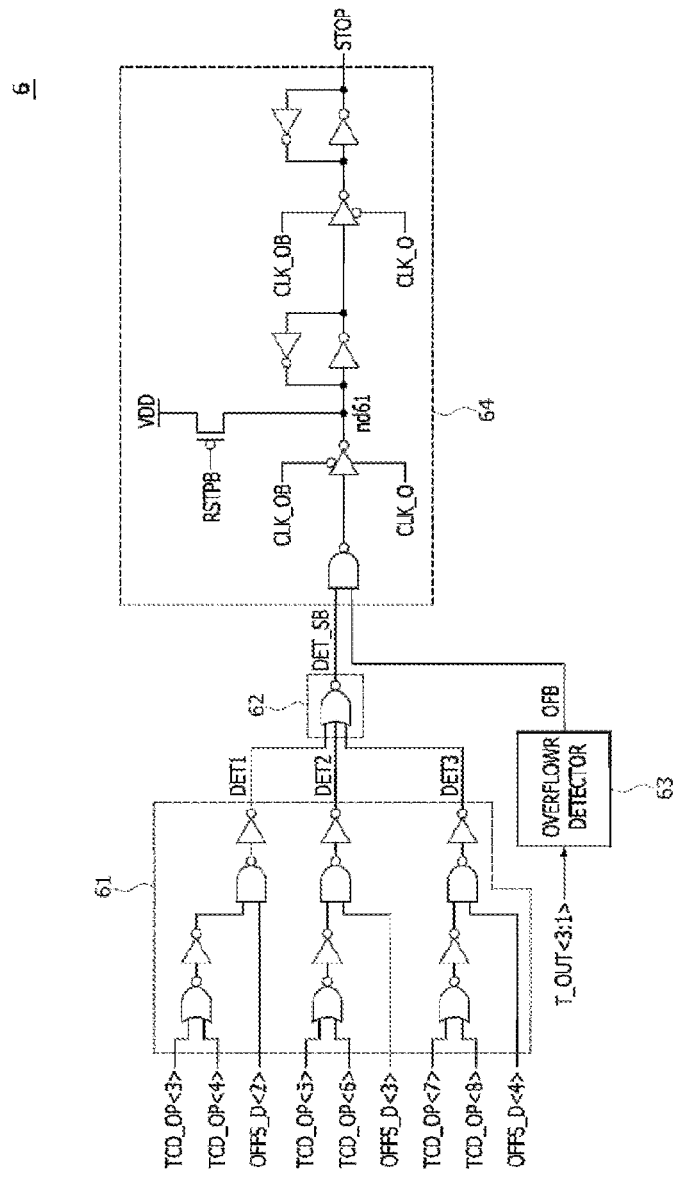
FIG. 7 is a circuit diagram illustrating a representation of an example of a stop signal generation circuit included in the semiconductor device of FIG. 1.

Referring to FIG. 7, the stop signal generation circuit 6 may include a detection signal generator 61, a detection signal synthesizer 62, an overflow detector 63 and a stop signal output circuit 64.

The detection signal generator 61 may generate a first detection signal DET1, a second detection signal DET2 and a third detection signal DET3. The detection signal generator 61 may generate the first detection signal DET1 which is enabled to have a logic "high" level if the operation temperature code signal TCD_OP<3> or the operation temperature code signal TCD_OP<4> is enabled to have a logic "high" level while the operation offset signal OFFS_D<2> is enabled to have a logic "high" level. The detection signal generator 61 may generate the second detection signal DET2 which is enabled to have a logic "high" level if the operation temperature code signal TCD_OP<5> or the operation temperature code signal TCD_OP<6> is enabled to have a logic "high" level while the operation offset signal OFFS_D<3> is enabled to have a logic "high" level. The detection signal generator 61 may generate the third detection signal DET3 which is enabled to have a logic "high" level if the operation temperature code signal TCD_OP<7> or the operation temperature code signal TCD_OP<8> is enabled to have a logic "high" level while the operation offset signal OFFS_D<4> is enabled to have a logic "high" level. In some embodiments, the first, second and third detection signals DET1, DET2 and DET3 may be set to be enabled to a logic "low" level.

The detection signal synthesizer 62 may synthesize the first, second and third detection signals DET1, DET2 and DET3 to generate a synthesized detection signal DET_SB. The detection signal synthesizer 62 may generate the synthesized detection signal DET_SB which is enabled to have a logic "low" level if at least one of the first, second and third detection signals DET1, DET2 and DET3 is enabled to have a logic "high" level. In some embodiments, the synthesized detection signal DET_SB may be set to be enabled to a logic "high" level.

The overflow detector 63 may detect a logic level combination of the output temperature signal T_OUT<3:1> to generate an overflow signal OFB. The overflow detector 63 may generate the overflow signal OFB which is enabled to have a logic "low" level if the output temperature signal T_OUT<3:1> is sequentially counted down to have a logic level combination of '000'. The fact that the output temperature signal T_OUT<3:1> has a logic level combination of '000' means that all of bits included in the output temperature signal T_OUT<3:1> have a logic "low" level. A logic level combination of the output temperature signal T_OUT<3:1> for enabling the overflow signal OFB may be set differently according to the embodiments.

The stop signal output circuit 64 may receive the synthesized detection signal DET_SB and the overflow signal OFB to generate the stop signal STOP in response to the delayed operation clock signal CLK_OD, the inverted delayed operation clock signal CLK_ODB and the inverted reset pulse signal RSTPB. The stop signal output circuit 64 may initialize a node nd61 to a logic "high" level corresponding to a power supply voltage VDD if the inverted reset pulse signal RSTPB inputted to the stop signal output circuit 64 is enabled to have a logic "low" level. The stop signal output circuit 64 may generate the stop signal STOP which is enabled to have a logic "high" level in synchronization with the operation clock signal CLK_O and the inverted operation clock signal CLK_OB if the synthesized detection signal DET_SB or the overflow signal OFB is enabled to have a logic "low" level.

An operation of the semiconductor device having an aforementioned configuration will be described hereinafter with reference to FIGS. 8 to 12.

The offset signal OFFS<2:1> may be inputted to the semiconductor device if a temperature difference exists between a sensed temperature sensed by a temperature sensor (not illustrated) included in the semiconductor device and an actual internal temperature of the semiconductor device. The offset signal OFFS<2:1> may be provided by an external device. However, in some embodiments, the offset signal OFFS<2:1> may be generated in the semiconductor device. The offset signal OFFS<2:1> may include offset information on the temperature difference between the sensed temperature and the internal temperature. Referring to FIG. 8, a temperature difference (i.e., an offset value) between the sensed temperature and the internal temperature may be set to be zero if the offset signal OFFS<2:1> has a logic level combination of '00', and the temperature difference between the sensed temperature and the internal temperature may be set to be 20 degrees Celsius if the offset signal OFFS<2:1> has a logic level combination of '01'. Moreover, the temperature difference between the sensed temperature and the internal temperature may be set to be 40 degrees Celsius if the offset signal OFFS<2:1> has a logic level combination of '10', and the temperature difference between the sensed temperature and the internal temperature may be set to be 60 degrees Celsius if the offset signal OFFS<2:1> has a logic level combination of '11'. The fact that the offset signal OFFS<2:1> has a logic level combination of '01' means that a first bit OFFS<1> of the offset signal OFFS<2:1> has a logic "high" level and a second bit OFFS<2> of the offset signal OFFS<2:1> has a logic "low" level.

The operation offset signal OFFS_D<4:1> may be generated by decoding the offset signal OFFS<2:1>. Referring to FIG. 8, a logic level combination of the operation offset signal OFFS_D<4:1> may be provided according to a logic level combination of the offset signal OFFS<2:1>. That is, the operation offset signal OFFS_D<4:1> may have a logic level combination of '0001' if the offset signal OFFS<2:1> has a logic level combination of '00', and the operation offset signal OFFS_D<4:1> may have a logic level combination of '0010' if the offset signal OFFS<2:1> has a logic level combination of '01'. The operation offset signal OFFS_D<4:1> may have a logic level combination of '0100' if the offset signal OFFS<2:1> has a logic level combination of '10', and the operation offset signal OFFS_D<4:1> may have a logic level combination of '1000' if the offset signal OFFS<2:1> has a logic level combination of '11'. The fact that the operation offset signal OFFS_D<4:1> has a logic level combination of '0001' means that a first bit OFFS_D<1> of the operation offset signal OFFS_D<4:1> has a logic "high" level and second to fourth bits OFFS_D<4:2> of the operation offset signal OFFS_D<4:1> have a logic "low" level.

Figure 9:
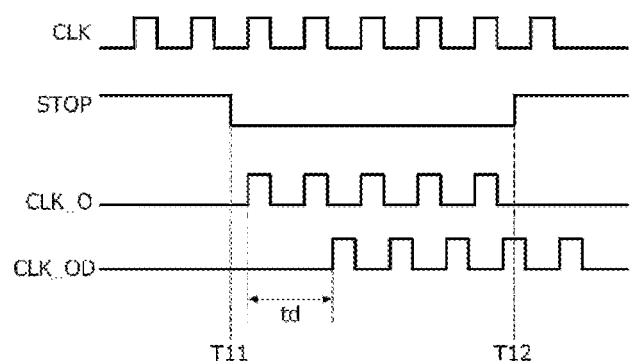
FIG. 9 is a timing diagram illustrating a representation of an example of an operation of the operation clock generation circuit illustrated in FIG. 2.

The operation clock signal CLK_O and the delayed operation clock signal CLK_OD may be generated from the clock signal CLK while the stop signal STOP is disabled. Referring to FIG. 9, it may be confirmed that the operation clock signal CLK_O and the delayed operation clock signal CLK_OD are generated during a section (from a point of time "T11" till a point of time "T12") that the stop signal STOP is disabled to have a logic "low" level. The operation clock signal CLK_O may be generated by buffering the clock signal CLK during the section (from the point of time "T11" till the point of time "T12") that the stop signal STOP is disabled to have a logic "low" level, and the delayed operation clock signal CLK_OD may be generated by delaying the operation clock signal CLK_O by a predetermined delay time Td.

If the reset pulse signal RSTP is generated to be enabled, the sensed temperature signal TS<3:1> may be buffered in synchronization with the operation clock signal CLK_O and the delayed operation clock signal CLK_OD and the buffered signal may be outputted as the output temperature signal T_OUT<3:1>. If the reset pulse signal RSTP is generated to be disabled, a counting operation on the output temperature signal T_OUT<3:1> may be executed in synchronization with the operation clock signal CLK_O and the delayed operation clock signal CLK_OD. In an embodiment, the output temperature signal T_OUT<3:1> may be set to be counted down bit by bit in synchronization with the operation clock signal CLK_O and the delayed operation clock signal CLK_OD.

The output temperature signal T_OUT<3:1> may be counted down bit by bit until the stop signal STOP is enabled. The stop signal STOP may be enabled if the operation temperature code signal TCD_OP<8:1> and the operation offset signal OFFS_D<4:1> are signals corresponding to each other. An operation that the stop signal STOP is enabled will be described hereinafter with reference to FIGS. 10 to 12.

Referring to FIG. 10, logic level combinations of each of the output temperature signal T_OUT<3:1>, the temperature decoded code signal T_DEC<8:1> and the temperature difference code signal T_DIF<2:1> corresponding to various internal temperatures are provided. In case of the output temperature signal T_OUT<3:1>, logic level combinations of '111', '110', '101', '100', '011', '010', '001' and '000' may correspond to the internal temperatures of 10 degrees Celsius, 30 degrees Celsius, 50 degrees Celsius, 60 degrees Celsius, 70 degrees Celsius, 80 degrees Celsius, 100 degrees Celsius and 120 degrees Celsius, respectively. In case of the temperature decoded code signal T_DEC<8:1>, logic level combinations of '00000001', '00000010', '00000100', '00001000', '00010000', '00100000', '01000000' and '10000000' may correspond to the internal temperatures of 10 degrees Celsius, 30 degrees Celsius, 50 degrees Celsius, 60 degrees Celsius, 70 degrees Celsius, 80 degrees Celsius, 100 degrees Celsius and 120 degrees Celsius, respectively. Logic level combinations of each of the output temperature signal T_OUT<3:1> and the temperature decoded code signal T_DEC<8:1> corresponding to various internal temperatures may be set differently according to the embodiments.

Referring again to FIG. 10, in case of the temperature difference code signal T_DIF<2:1>, logic level combinations of '10', '10', '01', '01', '01', '10' and '10' may correspond to the internal temperatures of 10 degrees Celsius, 30 degrees Celsius, 50 degrees Celsius, 60 degrees Celsius, 70 degrees Celsius, 80 degrees Celsius and 100 degrees Celsius, respectively. In an embodiment, a logic level combination of '01' in the temperature difference code signal T_DIF<2:1> means that the internal temperature increases by 10 degrees Celsius, and a logic level combination of '10' in the temperature difference code signal T_DIF<2:1> means that the internal temperature increases by 20 degrees Celsius. That is, the temperature difference code signal T_DIF<2:1> may have a logic level combination of '01' when the internal temperature is 50 degrees Celsius because the next high internal temperature is 60 degrees Celsius, and the temperature difference code signal T_DIF<2:1> may have a logic level combination of '10' when the internal temperature is 30 degrees Celsius because the next high internal temperature is 50 degrees Celsius. When the internal temperature is 120 degrees Celsius, a logic level combination of the temperature difference code signal T_DIF<2:1> may not be set because the next high internal temperature is not provided. Logic level combinations of the temperature difference code signal T_DIF<2:1> corresponding to the various internal temperatures may be set differently according to the embodiments.

Referring to FIG. 11, logic level combinations of the operation temperature code signal TCD_OP<8:1> corresponding to various logic level combinations of the sum temperature code signal T_SUM<3:1> are provided. That is, logic level combinations of '000', '001', '010', '011', '100', '101', '110' and '111' in the sum temperature code signal T_SUM<3:1> may correspond to logic level combinations of '00000001', '00000010', '00000100', '00001000', '00010000', '00100000', '01000000' and '10000000' in the operation temperature code signal TCD_OP<8:1>, respectively.

Referring again to FIG. 11, logic level combinations of the operation offset signal OFFS_D<4:1> corresponding to various logic level combinations of the operation temperature code signal TCD_OP<8:1> are provided. That is, logic level combinations of '00000001' and '00000010' in the operation temperature code signal TCD_OP<8:1> may correspond to a logic level combination of '0001' in the operation offset signal OFFS_D<4:1>, and logic level combinations of '00000100' and '00001000' in the operation temperature code signal TCD_OP<8:1> may correspond to a logic level combination of '0010' in the operation offset signal OFFS_D<4:1>. Moreover, logic level combinations of '00010000' and '00100000' in the operation temperature code signal TCD_OP<8:1> may correspond to a logic level combination of '0100' in the operation offset signal OFFS_D<4:1>, and logic level combinations of '01000000' and '10000000' in the operation temperature code signal TCD_OP<8:1> may correspond to a logic level combination of '1000' in the operation offset signal OFFS_D<4:1>. Logic level combinations of the operation offset signal OFFS_D<4:1> corresponding to various logic level combinations of the operation temperature code signal TCD_OP<8:1> may be set differently according to the embodiments.

Figure 12:
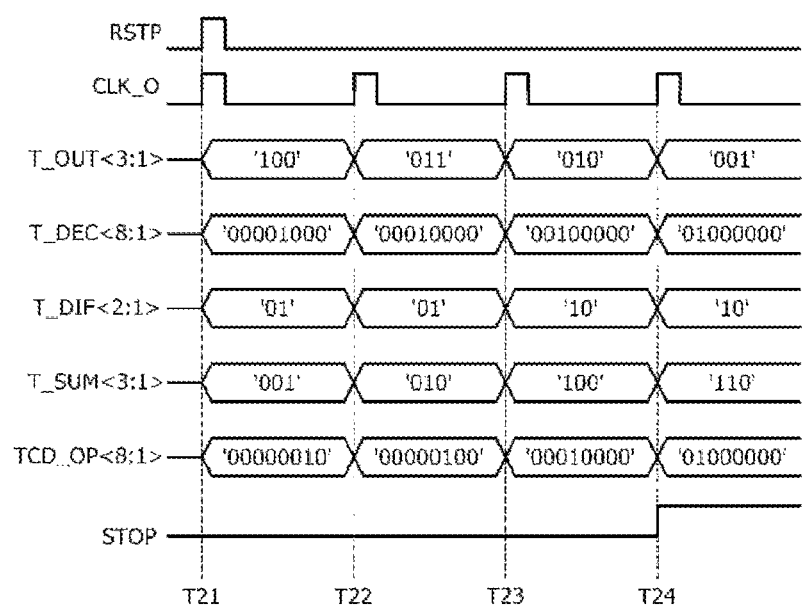

An operation for generating the stop signal STOP will be described hereinafter with reference to FIGS. 10, 11 and 12 under the assumption, for example, that a temperature difference (i.e., the offset value of FIG. 8) between the sensed temperature and the internal temperature is set to be 40 degrees Celsius so that the operation offset signal OFFS_D<4:1> has a logic level combination of '0100'.

At a point of time "T21", the output temperature signal T_OUT<3:1> may have a logic level combination of '100' if the reset pulse signal RSTP is enabled. The output temperature signal T_OUT<3:1> may be counted down bit by bit in synchronization with pulses of the operation clock signal CLK_O that are inputted at points of time "T22", "T23" and "T24" while the stop signal STOP is disabled to have a logic "low" level. Thus, the output temperature signal T_OUT<3:1> may have logic level combinations of '011', '010' and '001' corresponding to 70 degrees Celsius, 80 degrees Celsius and 100 degrees Celsius at the points of time "T22, "T23" and "T24, respectively.

At the points of time "T21, "T22", "T23" and "T24", logic level combinations of the temperature difference code signal T_DIF<2:1> corresponding to logic level combinations of the output temperature signal T_OUT<3:1> may be sequentially added to have '01', '01', '10' and '10' and to generate the sum temperature code signal T_SUM<3:1>. At the point of time "T24", the sum temperature code signal T_SUM<3:1> may have a logic level combination of '110', and the operation temperature code signal TCD_OP<8:1> may be generated to have a logic level combination of '01000000'. Referring to FIG. 11, the stop signal STOP may be enabled to have a logic "high" level because the operation temperature code signal TCD_OP<8:1> has a logic level combination of '01000000' corresponding to a logic level combination of '1000' in the operation offset signal OFFS_D<4:1>. In such a case, since the output temperature signal T_OUT<3:1> has a logic level combination of '001' corresponding to the internal temperature of 100 degrees Celsius, the output temperature signal T_OUT<3:1> corresponding to an internal temperature higher than a sensed temperature by 40 degrees Celsius may be generated.

As described above, a semiconductor device according to an embodiment may control an internal operation thereof by generating an output temperature signal in which offset information is reflected. Thus, malfunction of the semiconductor device due to a temperature difference between a sensed temperature and an internal temperature may be prevented. In addition, a semiconductor device according to an embodiment may change the output temperature signal by varying offset information to control a refresh cycle time that varies according to a logic level combination of the output temperature signal. Moreover, if a pulse of a reset pulse signal occurs, the semiconductor device according to an embodiment may update a sensed temperature signal to generate the output temperature signal and may generate the output temperature signal again using the offset information to prevent a phenomenon that updated result of the sensed temperature signal is not reflected.

Figure 13:
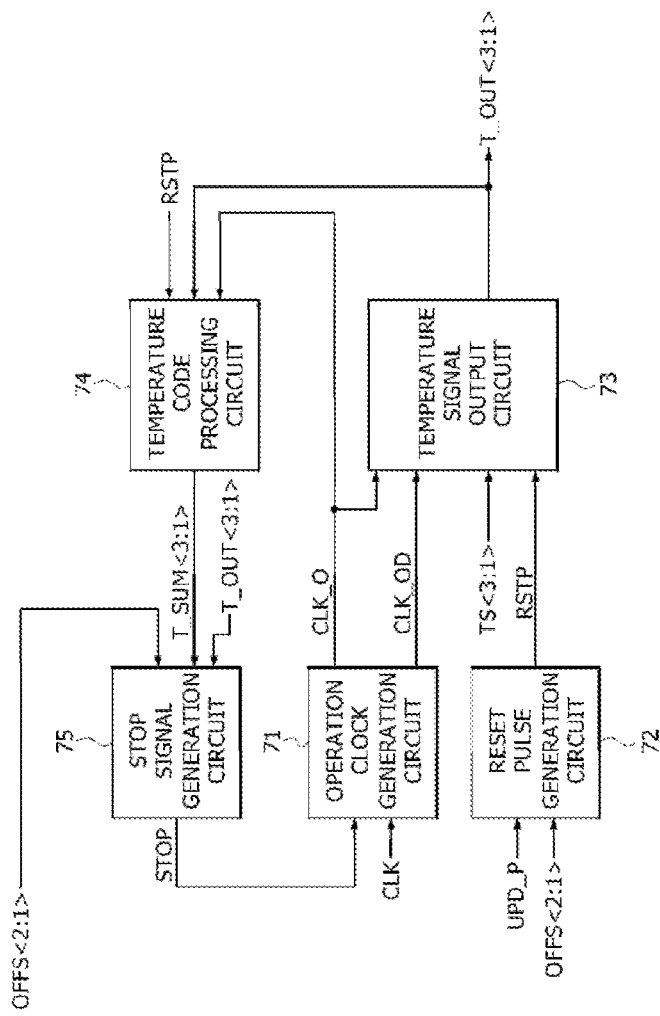
FIG. 13 is a block diagram illustrating a representation of an example of a semiconductor device according to another embodiment.

Referring to FIG. 13, a semiconductor device according to an embodiment may include an operation clock generation circuit 71, a reset pulse generation circuit 72, a temperature signal output circuit 73, a temperature code processing circuit 74, and a stop signal generation circuit 75.

The operation clock generation circuit 71 may generate an operation clock signal CLK_O and a delayed operation clock signal CLK_OD from a clock signal CLK in response to a stop signal STOP. For example, the operation clock generation circuit 71 may buffer the clock signal CLK to generate the operation clock signal CLK_O and may delay the operation clock signal CLK_O by a predetermined time to generate the delayed operation clock signal CLK_OD, while the stop signal STOP is disabled. The operation clock generation circuit 71 may have substantially the same configuration and function as the operation clock generation circuit 2 described with reference to FIG. 2. Thus, a description of the operation clock generation circuit 71 will be omitted hereinafter.

The reset pulse generation circuit 72 may generate a reset pulse signal RSTP in response to an update signal UPD_P and an offset signal OFFS<2:1>. For example, the reset pulse generation circuit 72 may generate the reset pulse signal RSTP which is enabled if the update signal UPD_P is enabled or the offset signal OFFS<2:1> has a predetermined logic level combination. The update signal UPD_P may be set to be enabled whenever a predetermined update section elapses. For example, the update signal UPD_P may be set to be enabled whenever a time of 8 milliseconds elapses if the operation clock signal CLK_O has a cycle time of 0.5 microseconds. The offset signal OFFS<2:1> may be set to have the predetermined logic level combination when a temperature difference between an actual internal temperature and a sensed temperature of the semiconductor device is zero. The reset pulse generation circuit 72 may have substantially the same configuration and function as the reset pulse generation circuit 3 described with reference to FIGS. 1 and 3, except for the input signals thereof. Thus, a description of the reset pulse generation circuit 72 will be omitted hereinafter.

The temperature signal output circuit 73 may receive a sensed temperature signal TS<3:1> to output an output temperature signal T_OUT<3:1> in response to the reset pulse signal RSTP, the operation clock signal CLK_O and the delayed operation clock signal CLK_OD. The temperature signal output circuit 73 may buffer the sensed temperature signal TS<3:1> to output the output temperature signal T_OUT<3:1> in synchronization with the operation clock signal CLK_O, if the reset pulse signal RSTP is enabled. The temperature signal output circuit 73 may perform a predetermined arithmetic operation on the output temperature signal T_OUT<3:1> in synchronization with the operation clock signal CLK_O and may output the output temperature signal T_OUT<3:1> in synchronization with the operation clock signal CLK_O, while the reset pulse signal RSTP is not generated. For example, the temperature signal output circuit 73 may output the output temperature signal T_OUT<3:1> that is counted in synchronization with the operation clock signal CLK_O, while the reset pulse signal RSTP is not generated. The temperature signal output circuit 73 may have substantially the same configuration and function as the temperature signal output circuit 4 described with reference to FIGS. 1, 4, and 5. Thus, a description of the temperature signal output circuit 73 will be omitted hereinafter.

The temperature code processing circuit 74 may generate a sum temperature code signal T_SUM<3:1> from the output temperature signal T_OUT<3:1> in response to the operation clock signal CLK_O. The temperature code processing circuit 74 may generate the sum temperature code signal T_SUM<3:1> by adding temperature difference information about each internal temperature corresponding to the output temperature signal T_OUT<3:1> that is inputted in synchronization with the operation clock signal CLK_O. The temperature code processing circuit 74 may initialize the sum temperature code signal T_SUM<3:1> if the reset pulse signal RSTP is enabled. A configuration and an operation of the temperature code processing circuit 74 will be described with reference to FIG. 14 later.

The stop signal generation circuit 75 may generate the stop signal STOP in response to the sum temperature code signal T_SUM<3:1>, the offset signal OFFS<2:1> and the output temperature signal T_OUT<3:1>. For example, the stop signal generation circuit 75 may generate the stop signal STOP which is enabled if the sum temperature code signal T_SUM<3:1> and the offset signal OFFS<2:1> are signals that correspond to each other. The stop signal generation circuit 75 may generate the stop signal STOP which is enabled if the output temperature signal T_OUT<3:1> has a predetermined logic level combination that cannot perform arithmetic operations any more. The stop signal generation circuit 75 may have substantially the same configuration and function as the stop signal generation circuit 6 described with reference to FIG. 7, except for the input and output signals thereof. Thus, a description of the stop signal generation circuit 75 will be omitted hereinafter.

Figure 14:
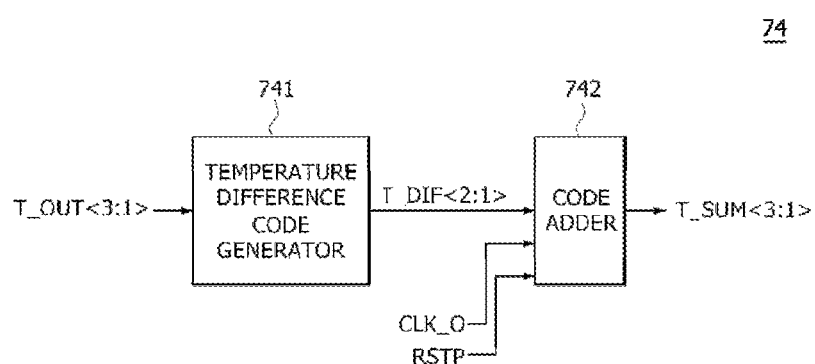
FIG. 14 is a block diagram illustrating a representation of an example of a temperature code processing circuit included in the semiconductor device of FIG. 13.

Referring to FIG. 14, the temperature code processing circuit 74 may include a temperature difference code generator 741 and a code adder 742.

The temperature difference code generator 741 may generate a temperature difference code signal T_DIF<2:1> in response to the output temperature signal T_OUT<3:1>. The temperature difference code generator 741 may generate the temperature difference code signal T_DIF<2:1> including the temperature difference information about each internal temperature of the semiconductor device corresponding to a logic level combination of the output temperature signal T_OUT<3:1>.

The code adder 742 may add the temperature difference code signal T_DIF<2:1> to generate the sum temperature code signal T_SUM<3:1> in response to the operation clock signal CLK_O. For example, the code adder 742 may sequentially add the temperature difference code signal T_DIF<2:1> inputted in synchronization with the operation clock signal CLK_O to generate the sum temperature code signal T_SUM<3:1>. The code adder 742 may initialize the sum temperature code signal T_SUM<3:1> if the reset pulse signal RSTP is enabled. A logic level combination of the sum temperature code signal T_SUM<3:1> which is initialized may be set differently according to the embodiments.

Figure 17:
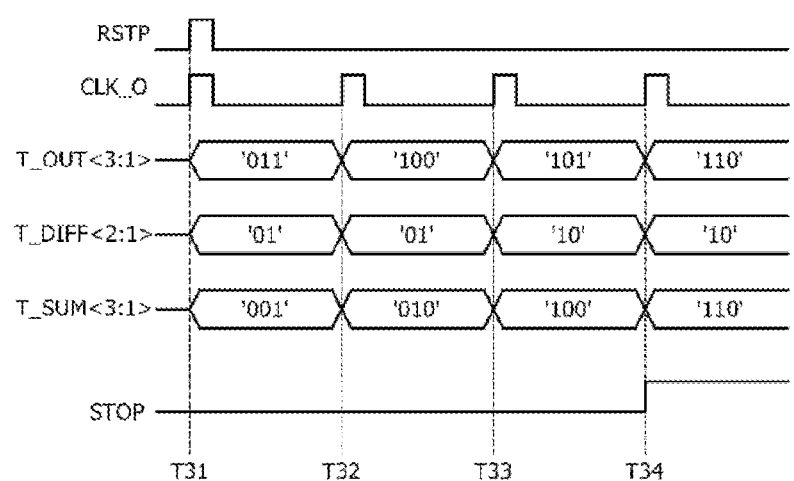

In a semiconductor device having the aforementioned configurations, an operation that the stop signal STOP is enabled will be described hereinafter with reference to FIGS. 15 to 17.

Referring to FIG. 15, logic level combinations of each of the output temperature signal T_OUT<3:1> and the temperature difference code signal T_DIF<2:1> corresponding to various internal temperatures are provided. In the case of the output temperature signal T_OUT<3:1>, logic level combinations of '000', '001', '010', '011', '100', '101', '110' and '111' may correspond to the internal temperatures of 10 degrees Celsius, 30 degrees Celsius, 50 degrees Celsius, 60 degrees Celsius, 70 degrees Celsius, 80 degrees Celsius, 100 degrees Celsius and 120 degrees Celsius, respectively. In the case of the temperature difference code signal T_DIF<2:1>, logic level combinations of '10', '10', '01', '01', '01', '10' and '10' may correspond to the internal temperatures of 10 degrees Celsius, 30 degrees Celsius, 50 degrees Celsius, 60 degrees Celsius, 70 degrees Celsius, 80 degrees Celsius and 100 degrees Celsius, respectively. In an embodiment, a logic level combination of '01' in the temperature difference code signal T_DIF<2:1> means that the internal temperature increases by 10 degrees Celsius, and a logic level combination of '10' in the temperature difference code signal T_DIF<2:1> means that the internal temperature increases by 20 degrees Celsius. That is, the temperature difference code signal T_DIF<2:1> may have a logic level combination of '01' when the internal temperature is 50 degrees Celsius because the next high internal temperature is 60 degrees Celsius, and the temperature difference code signal T_DIF<2:1> may have a logic level combination of '10' when the internal temperature is 30 degrees Celsius because the next high internal temperature is 50 degrees Celsius. When the internal temperature is 120 degrees Celsius, a logic level combination of the temperature difference code signal T_DIF<2:1> may not be set because the next high internal temperature is not provided. Logic level combinations of the temperature difference code signal T_DIF<2:1> corresponding to the various internal temperatures may be set differently according to the embodiments.

Referring to FIG. 16, logic level combinations of the offset signal OFFS<2:1> corresponding to various logic level combinations of the sum temperature code signal T_SUM<3:1> are provided. That is, logic level combinations of '000' and '001' in the sum temperature code signal T_SUM<3:1> may correspond to a logic level combination of '00' in the offset signal OFFS<2:1>, and logic level combinations of '010' and '011' in the sum temperature code signal T_SUM<3:1> may correspond to a logic level combination of '01' in the offset signal OFFS<2:1>. Logic level combinations of '100' and '101' in the sum temperature code signal T_SUM<3:1> may correspond to a logic level combination of '10' in the offset signal OFFS<2:1>, and logic level combinations of '110' and '111' in the sum temperature code signal T_SUM<3:1> may correspond to a logic level combination of '11' in the offset signal OFFS<2:1>. Logic level combinations of the offset signal OFFS<2:1> corresponding to various logic level combinations of the sum temperature code signal T_SUM<3:1> may be set differently according to the embodiments.

An operation for generating the stop signal STOP will be described hereinafter with reference to FIGS. 15, 16 and 17 under the assumption, for example, that a temperature difference between the sensed temperature and the internal temperature is set to be 40 degrees Celsius so that the offset signal OFFS<2:1> has a logic level combination of '10'.

At a point of time "T31", the output temperature signal T_OUT<3:1> may have a logic level combination of '011' if the reset pulse signal RSTP is enabled. The output temperature signal T_OUT<3:1> may be counted up bit by bit in synchronization with pulses of the operation clock signal CLK_O that are inputted at points of time "T32", "T33" and "T34" while the stop signal STOP is disabled to have a logic "low" level. Thus, the output temperature signal T_OUT<3:1> may have logic level combinations of '100', '101' and '110' corresponding to 70 degrees Celsius, 80 degrees Celsius and 100 degrees Celsius at the points of time "T32, "T33" and "T34, respectively.

At the points of time "T31, "T32", "T33" and "T34", logic level combinations of the temperature difference code signal T_DIF<2:1> corresponding to logic level combinations of the output temperature signal T_OUT<3:1> may be sequentially added to have '01', '01', '10' and '10' and to generate the sum temperature code signal T_SUM<3:1>. At the point of time "T34", the sum temperature code signal T_SUM<3:1> may have a logic level combination of '110'. The stop signal STOP may be enabled to have a logic "high" level because the sum temperature code signal T_SUM<3: 1> has a logic level combination of '110' corresponding to a logic level combination of '10' in the offset signal OFFS<2:1>. In such a case, since the output temperature signal T_OUT<3:1> has a logic level combination of '110' corresponding to the internal temperature of 100 degrees Celsius, the output temperature signal T_OUT<3:1> corresponding to an internal temperature higher than the sensed temperature by 40 degrees Celsius may be generated.

As described above, a semiconductor device according to an embodiment may control an internal operation thereof by generating an output temperature signal in which offset information is reflected. Thus, malfunction of the semiconductor device due to a temperature difference between a sensed temperature and an internal temperature may be prevented. In addition, the semiconductor device according to an embodiment may change the output temperature signal by varying offset information to control a refresh cycle time that varies according to a logic level combination of the output temperature signal. Moreover, if a pulse of a reset pulse signal occurs, the semiconductor device according to an embodiment may update a sensed temperature signal to generate the output temperature signal and may generate the output temperature signal again using the offset information to prevent a phenomenon that updated result of the sensed temperature signal is not reflected.

Figure 18:
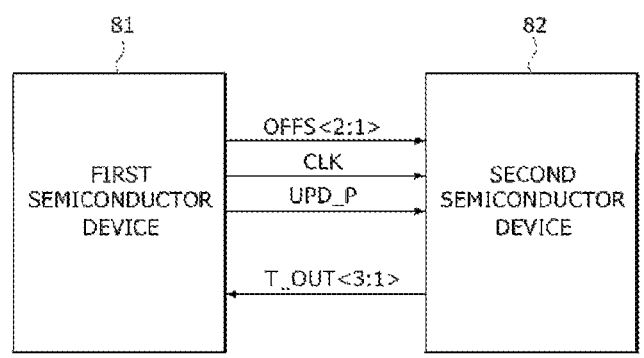
FIG. 18 is a block diagram illustrating a representation of an example of a semiconductor system including the semiconductor device illustrated in FIG. 1 or 13.

Referring to FIG. 18, a semiconductor system according to an embodiment may include a first semiconductor device 81 and a second semiconductor device 82.

The first semiconductor device 81 may apply an offset signal OFFS<2:1>, a clock signal CLK and an update signal UPD_P to the second semiconductor device 82. The first semiconductor device 81 may receive an output temperature signal T_OUT<3:1> from the second semiconductor device 82 to verify the offset signal OFFS<2:1> including offset information on a temperature difference between a sensed temperature and an internal temperature. The second semiconductor device 82 may be realized using any one of the semiconductor devices described with reference to FIGS. 1 to 17. Thus, a configuration and an operation of the second semiconductor device 82 will be omitted.

At least one of the semiconductor devices and the semiconductor system described with reference to FIGS. 1 to 18 may be applied to an electronic system that includes a memory system, a graphic system, a computing system, a mobile system, or the like. For example, as illustrated in FIG. 19, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor devices illustrated in FIG. 1 or 13. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003.

Figure 19:
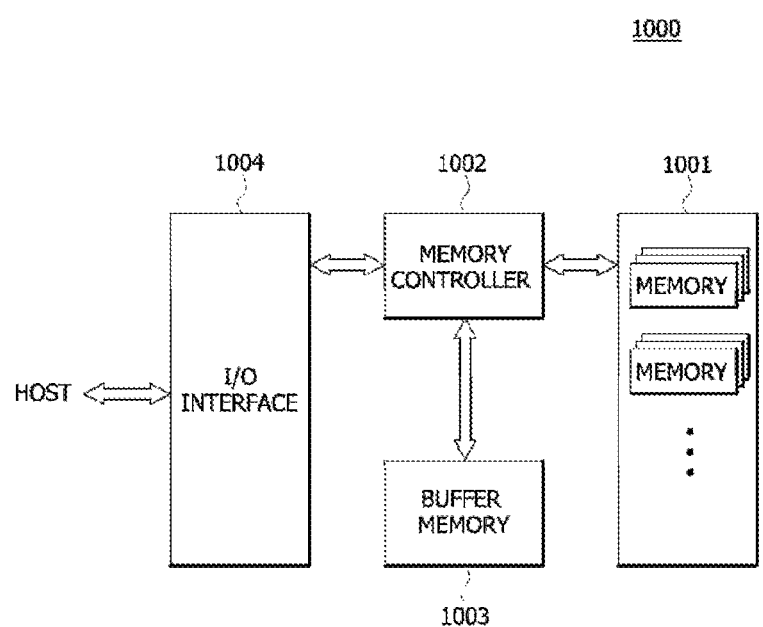
FIG. 19 is a block diagram illustrating a representation of an example of a configuration of an electronic system including at least one of the semiconductor devices illustrated in FIGS. 1 and 13.

Although FIG. 19 illustrates the memory controller 1002 with a single block, the memory controller 1002 may include one controller for controlling the data storage circuit 1001 comprised of a nonvolatile memory and another controller for controlling the buffer memory 1003 comprised of a volatile memory. The memory controller 1002 may include the first semiconductor device 81 illustrated in FIG. 18.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a stop signal generation circuit configured to compare an operation offset signal with an operation temperature code signal to generate a stop signal;
   a temperature signal output circuit configured to generate an output temperature signal from a sensed temperature signal in synchronization with an operation clock signal which is generated based on the stop signal; and
   a temperature code processing circuit configured to receive a temperature difference code signal corresponding to the output temperature signal to generate the operation temperature code signal in synchronization with the operation clock signal.

2. The semiconductor device of claim 1, wherein the operation offset signal includes offset information on a temperature difference between a sensed temperature and an internal temperature.

3. The semiconductor device of claim 1, wherein the stop signal generation circuit generates the stop signal which is enabled if the operation offset signal and the operation temperature code signal correspond to each other.

4. The semiconductor device of claim 1, wherein the stop signal generation circuit includes:
   a detection signal generator configured to generate a detection signal based on the operation offset signal and the operation temperature code signal;
   an overflow detector configured to generate an overflow signal based on the output temperature signal; and
   a stop signal output circuit configured to generate the stop signal based on the detection signal and the overflow signal.

5. The semiconductor device of claim 1,
   wherein the temperature signal output circuit generates the output temperature signal from the sensed temperature signal in synchronization with the operation clock signal if a reset pulse signal is enabled; and
   wherein the temperature signal output circuit performs a predetermined arithmetic operation on the output temperature signal in synchronization with the operation clock signal if the reset pulse signal is disabled.

6. The semiconductor device of claim 5, wherein the predetermined arithmetic operation is set to be an operation that counts the output temperature signal.

7. The semiconductor device of claim 1, wherein the temperature signal output circuit includes:
   a selection output circuit configured to output the sensed temperature signal or a variable temperature signal as the output temperature signal based on a reset pulse signal; and
   an arithmetic circuit configured to perform a predetermined arithmetic operation on the output temperature signal to generate the variable temperature signal in synchronization with the operation clock signal.

8. The semiconductor device of claim 1, wherein the temperature code processing circuit generates the operation temperature code signal by adding temperature differences about internal temperatures corresponding to the output temperature signal.

9. The semiconductor device of claim 1, wherein the temperature code processing circuit includes:
   a first decoder configured to decode the output temperature signal to generate a temperature decoded code signal;
   a temperature difference code generator configured to generate a temperature difference code signal corresponding to the temperature decoded code signal;
   a code adder configured to add the temperature difference code signal to generate a sum temperature code signal in synchronization with the operation clock signal; and
   a second decoder configured to decode the sum temperature code signal to generate the operation temperature code signal.

10. The semiconductor device of claim 1, further comprising an offset signal input circuit configured to decode an offset signal to generate the operation offset signal.

11. The semiconductor device of claim 1, further comprising an operation clock generation circuit configured to generate an operation clock signal from a clock signal based on the stop signal and configured to delay the operation clock signal by a predetermined time to generate a delayed operation clock signal.

12. The semiconductor device of claim 1, further comprising a reset pulse generation circuit configured to generate a reset pulse signal for initializing the output temperature signal based on an update signal and the operation offset signal.

13. The semiconductor device of claim 12,
   wherein the reset pulse generation circuit is configured to generate the reset pulse signal if at least one of either the update signal or the operation offset signal is enabled, and
   wherein the operation offset signal is enabled if a temperature difference between a sensed temperature and an internal temperature is zero.

14. A semiconductor device comprising:
   a temperature signal output circuit configured to generate an output temperature signal from a sensed temperature signal in synchronization with an operation clock signal if a reset pulse signal is enabled and configured to perform a predetermined arithmetic operation on the output temperature signal in synchronization with the operation clock signal if the reset pulse signal is disabled;
   a temperature code processing circuit configured to generate an operation temperature code signal by adding temperature differences about internal temperatures corresponding to the output temperature signal; and
   a stop signal generation circuit configured to generate a stop signal for controlling generation of the operation clock signal based on the operation temperature code signal.

15. The semiconductor device of claim 14, wherein the predetermined arithmetic operation is set to be an operation that counts the output temperature signal.

16. The semiconductor device of claim 14, wherein the temperature signal output circuit includes:
   a selection output circuit configured to output the sensed temperature signal or a variable temperature signal as the output temperature signal based on the reset pulse signal; and
   an arithmetic circuit configured to perform the predetermined arithmetic operation on the output temperature signal to generate the variable temperature signal in synchronization with the operation clock signal.

17. The semiconductor device of claim 14, wherein the temperature code processing circuit includes:
   a first decoder configured to decode the output temperature signal to generate a temperature decoded code signal;
   a temperature difference code generator configured to generate a temperature difference code signal corresponding to the temperature decoded code signal;
   a code adder configured to add the temperature difference code signal to generate a sum temperature code signal in synchronization with the operation clock signal; and
   a second decoder configured to decode the sum temperature code signal to generate the operation temperature code signal.

18. The semiconductor device of claim 14, wherein the stop signal generation circuit generates the stop signal which is enabled if an operation offset signal and the operation temperature code signal correspond to each other.

19. The semiconductor device of claim 18, wherein the operation offset signal includes offset information on a temperature difference between a sensed temperature and the internal temperature.

20. The semiconductor device of claim 18, further comprising an offset signal input circuit configured to decode an offset signal to generate the operation offset signal.

21. The semiconductor device of claim 14, wherein the stop signal generation circuit includes:

a detection signal generator configured to generate a detection signal based on an operation offset signal and the operation temperature code signal;

an overflow detector configured to generate an overflow signal based on the output temperature signal; and a stop signal output circuit configured to generate the stop signal based on the detection signal and the overflow signal.

22. The semiconductor device of claim 14, further comprising an operation clock generation circuit configured to generate the operation clock signal from a clock signal based on the stop signal and configured to delay the operation clock signal by a predetermined time to generate a delayed operation clock signal.

23. The semiconductor device of claim 14, further comprising a reset pulse generation circuit configured to generate a reset pulse signal for initializing the output temperature signal based on an update signal and the operation offset signal.

24. A semiconductor device comprising:

a stop signal generation circuit configured to compare an offset signal with a sum temperature code signal to generate a stop signal;

a temperature signal output circuit configured to generate an output temperature signal from a sensed temperature signal in synchronization with an operation clock signal which is generated based on the stop signal; and a temperature code processing circuit configured to receive a temperature difference code signal corresponding to the output temperature signal to generate the sum temperature code signal in synchronization with the operation clock signal.

25. The semiconductor device of claim 24, wherein the offset signal includes offset information on a temperature difference between a sensed temperature and an internal temperature.

26. The semiconductor device of claim 24, wherein the temperature code processing circuit generates the sum temperature code signal by adding temperature differences about internal temperatures corresponding to the output temperature signal.

27. The semiconductor device of claim 24, wherein the temperature code processing circuit includes:

a temperature difference code generator configured to generate a temperature difference code signal corresponding to the output temperature signal; and a code adder configured to add the temperature difference code signal to generate the sum temperature code signal in synchronization with the operation clock signal.

* * * * *